(12) United States Patent
Boroditsky et al.

(10) Patent No.: US 7,812,682 B2
(45) Date of Patent: Oct. 12, 2010

(54) CRYSTAL-BASED OSCILLATOR FOR USE IN SYNCHRONIZED SYSTEM

(75) Inventors: Roman Boroditsky, Hallandale Beach, FL (US); Jorge Gomez, Surfside, FL (US)

(73) Assignee: NEL Frequency Controls, Inc., Burlington, WI (US)

( * ) Notice: Subject to any disclaimer, the term of this patent is extended or adjusted under 35 U.S.C. 154(b) by 48 days.

(21) Appl. No.: 12/398,807

(22) Filed: Mar. 5, 2009

(65) Prior Publication Data

US 2010/0225403 A1 Sep. 9, 2010

(51) Int. Cl.
H03B 5/32 (2006.01)
(52) U.S. Cl. .......................... 331/160; 331/55; 331/158
(58) Field of Classification Search ............ 331/2, 331/46, 47, 49, 55, 116 FE, 116 R, 154, 158, 331/160, 172
See application file for complete search history.

(56) References Cited

U.S. PATENT DOCUMENTS

| | | | | |
|---|---|---|---|---|
| 3,592,960 | A * | 7/1971 | Cushing et al. | 348/507 |
| 4,166,984 | A * | 9/1979 | Jenkins | 331/1 A |
| 5,604,468 | A | 2/1997 | Gillig | |
| 5,929,713 | A * | 7/1999 | Kubo et al. | 331/49 |
| 6,154,095 | A | 11/2000 | Kano et al. | |
| 6,166,609 | A * | 12/2000 | Nakamiya et al. | 331/109 |
| 6,198,337 | B1 | 3/2001 | Matsuura | |
| 6,259,285 | B1 | 7/2001 | Woods | |
| 6,696,898 | B1 * | 2/2004 | Ward et al. | 331/116 FE |
| 7,003,062 | B1 | 2/2006 | Leyn | |
| 7,528,682 | B2 * | 5/2009 | Kawashima | 333/187 |
| 2005/0280455 | A1 | 12/2005 | Hutson | |
| 2008/0105054 | A1 * | 5/2008 | Kanai et al. | 73/514.29 |

FOREIGN PATENT DOCUMENTS

WO WO 02082656 10/2002

OTHER PUBLICATIONS

Article in DesignCon 2008; "The Future of Multi-Clock Systems"; by Stephens, Boroditsky, and Gomez; Feb. 8, 2008.
Stephens et al.; The Future of Multi-Clock Systems, DesignCon 2008. Feb. 4-7, 2008.
Mansuri. Low-Power Low-Jitter On-Chip Clock Generation. Department of Electrical Engineering. University of California - Los Angeles. 2003.
International Search Report for application No. PCT/US2010/025554; mailed May 3, 2010.

* cited by examiner

*Primary Examiner*—Robert Pascal
*Assistant Examiner*—Levi Gannon
(74) *Attorney, Agent, or Firm*—Nicholas A. Kees; Godfrey & Kahn, S.C.

(57) ABSTRACT

A crystal oscillator-based module, which includes a crystal resonator receiving a conditioned signal from a first bus and passing a resonator signal to a sustaining stage amplifier. A synchronization range expansion circuit is connected between a gain control network and the resonator. A tri-state buffer has a main input connected to receive the resonator signal through a buffer. The output of the tri-state buffer is connected to a second bus, through a matching network if necessary. A synchronous clock system can be formed by connecting these modules alternately to the two busses. The tri-state buffer also has a control input, which may be connected to a delay circuit between Vcc and ground, so as to allow hot swapping and for other benefits.

16 Claims, 2 Drawing Sheets

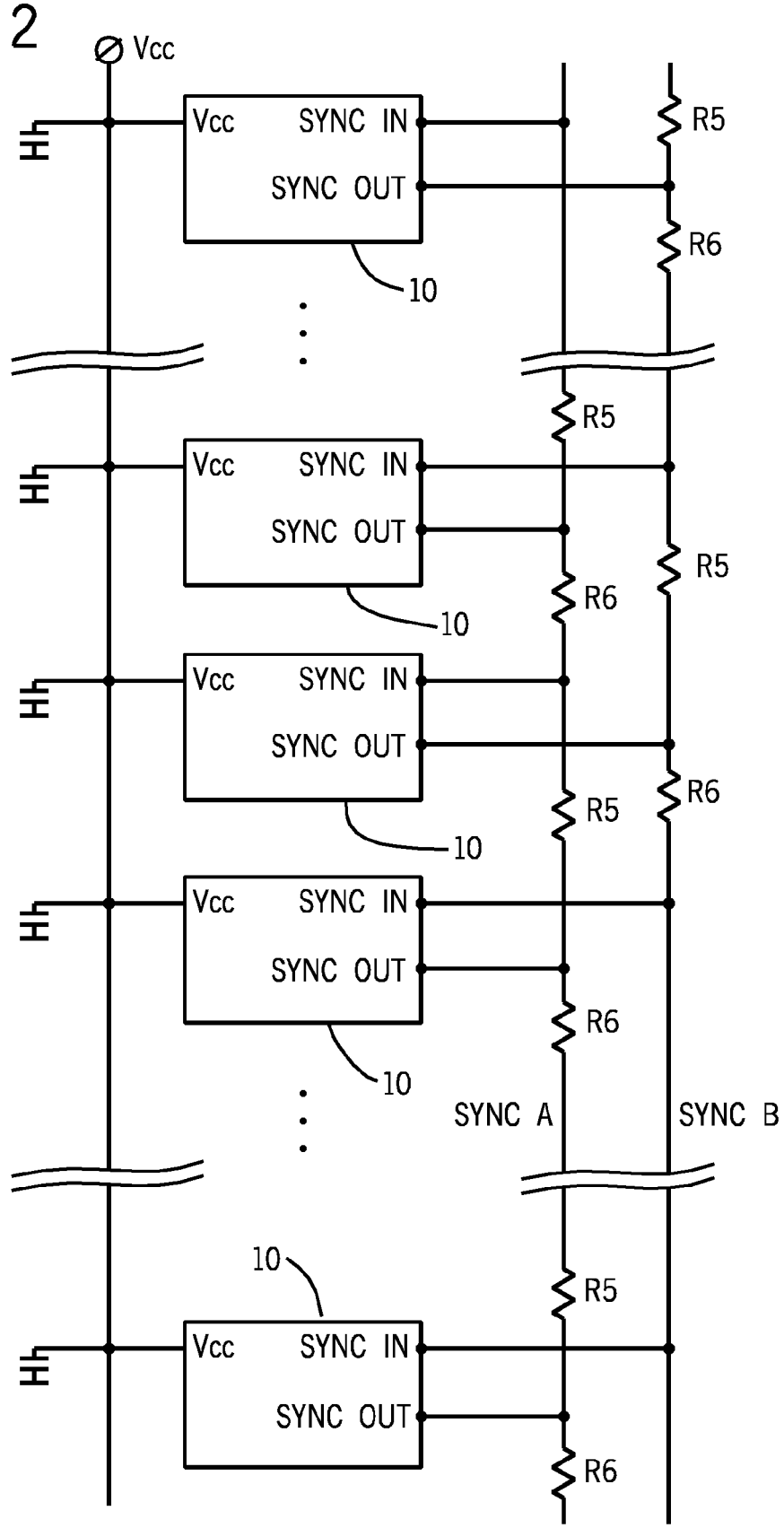

CRYSTAL-BASED OSCILLATOR FOR USE IN SYNCHRONIZED SYSTEM

BACKGROUND OF THE INVENTION

This invention relates to crystal oscillators, and specifically to crystal oscillators for use with other similar crystal oscillators in a synchronized system.

Clock signals are the most important control signals in digital systems. Regardless of the modulation scheme, the timing of logic transitions is dictated by the system's clock. The performance of a system at any level—on a chip, on a board, or across boards—is predicated by the coordination of clock signals among the components. Example known applications can be described as follows.

Synchronous Systems. Synchronous systems provide clock signals that are frequency locked at every transmission/reception exchange and require a design with zero skew to set the phase relationship between signal and clock. Difficulties in coordinating clock signals in synchronous systems differ at the chip, circuit, and system levels. On a chip, a single clock is easily distributed to drive every element and data-clock skew is easily controlled. The situation is more complicated at the circuit (multi-chip) and system (multi-board) levels. Synchronicity requires that either (1) a central clock be distributed across the circuit, (2) independent clocks local to circuit components be frequency locked, or (3) a low frequency reference clock be distributed across the circuit and multiplied up to the data rate at each component. Each of these solutions used in current systems introduces another layer of problems in component cost, design complexity, increased jitter and noise, and reduced reliability. Additionally, the difficulties increase further with component count and separation distance.

In an ideal synchronous circuit, every change in the logic levels of every component is defined by the level change of a common clock signal simultaneously; the timing of all events can be safely assumed, and there is no need for active components to monitor and coordinate the timing of different events. In practice, logic transitions have finite rise/fall times, signal propagation has delay, and registers have nonzero latch times which combine to dictate the maximum possible system speed. At the chip level, the combination of the clock quality and the delay of each component set a limit on the maximum clock speed. At the circuit and system levels, things are different, all events may not be simultaneous, but the timing of every event is coordinated at the system level. In inter-board systems (e.g. server blade applications), a module operating in one clock domain inevitably needs to send data to another module operating in a second clock domain Current synchronous systems distribute a common clock signal by fanning out a master clock to each component of the system. A single input clock signal is redriven by several output buffers. The buffers have propagation delay, though fanouts are available that incorporate phase-locked loops (PLLs) to eliminate skews between the outputs. However, PLLs introduce jitter. When more than one fanout part is required, it is important to include adjustable delay in the circuit to eliminate skew between fanout models. In many current applications, a low frequency clock is fanned out across a system and the clock is multiplied to the data rate at each component. The jitter of the PLL multiplier's Voltage Controlled Oscillator (VCO) is added to the clock signal and, as a result of multiplication, the jitter of the clock itself increases as the square of the multiplication factor.

Another current technique for clock distribution is to simply daisy chain a single clock signal across the system. At each component, a well-tuned delay must be provided to synchronize the system. In practice, it is difficult to match impedances so perfectly that the clock signal isn't reflected at each tap. Multiple reflections interfere with the signal and introduce noise and jitter.

Skew is the fixed timing between two signals. The primary cause of skew is the difference in trace length, but anything that affects signal propagation can contribute: trade width and impedance, variations in dielectric constants, and temperature. If the receiver samples the data on the rising edge of the clock signal, then as long as the clock provides the receiver a rising edge at the right time, there is no relevant skew. However, taking jitter into account, assuring that the same clock edge that was used to generate a data transition is also used to strobe that transition at the receiver can dramatically decrease the effective jitter of the system. If the data system and the clock signal both have the same jitter, they can trace each other. Insuring that the clock used in a receiver ha the same jitter as the data is one of the driving motivations for adopting asynchronous architectures.

Asynchronous Systems. Asynchronous systems have more autonomous components than synchronous systems; they are not frequency-locked or phase-locked and, between components, delay and skew are not an issue. At the transmitter, the clock signal determines logic transitions and, at the receiver, rather than a simple incoming data with the trivial assumption of synchronous timing, a separate clock must be at least temporarily phase-locked and frequency-locked so that bits can be sampled at their centers.

Current asynchronous architectures have several advantages over synchronous designs at the inter-board level, few advantages at the circuit level, and, except in the most rare cases, no advantages at the chip level. Asynchronous systems solve several of the problems presented by common synchronous systems: fanout and the associated increased jitter does not present a problem, skew is not a problem, and having multiple clocks reduces the possibility of catastrophic central clock failure. The autonomous nature of asynchronous architecture provides scalability and redundancy. The reduced coordination between boards provides for easier addition and subtraction as needed.

However, different components must still communicate in the systems, and to do so, an element of synchronicity is required. The first sacrifice made in moving from a synchronous to an asynchronous architecture is the seamless transparent timing of each event in the system. This amounts to surrendering the ultra-high performance that can only be attained in a system where every event occurs in harmony. One way to achieve the level of synchronization necessary for communication in an asynchronous system is to have the transmission of a data signal controlled by one clock, and its reception controlled by another. Another way is to use a clock recovery system. Here, the VCO of a PLL is locked to the transitions of the incoming data and is used to strobe the receiver; the clock used to reconstruct incoming data is embedded in the data itself. Other than within the clock recovery circuit where the positioning of the strobe must be well centered in the setup and hold comfort zone of the receiver, problems with skew are eliminated. The wider the bandwidth of the clock recovery circuit, the more that jitter on the clock tracks jitter on the data. In some designs, a low frequency clock signal is distributed to the receiver to aid the clock recovery circuit. PLL-based clock recovery circuits are expensive components, and the digital alternative, a Phase Interpolator (PI), is less expensive but more difficult to characterize. PIs are also more likely to suffer nonlinear effects and usually require a distributed clock.

The general concept of having two synchronization busses and connecting clock modules to them alternatingly was described in The Future of Multi-Clock Systems, by Ransom Stephens, Roman Boroditsky and Jorge Gomez, DesignCon 2008. That paper described a synchronous clock circuit with the Sync In of a first SXO module being connected to the Sync A bus, the Sync Out of the first SXO module being connected to the Sync B bus, the Sync In of a second SXO module being connected to the Sync B bus, the Sync Out of the SXO second module being connected to the Sync A bus.

SUMMARY OF THE INVENTION

The synchronous clock circuit described in the Stephens paper, however, will not work with a SXO module of just any design. A need therefore exists to provide a clock synchronization system with many of the benefits of asynchronous structure—including no central clock, no fanout or buffers, no PLLs, and therefore none of problems associated with these extra components—and all of the benefits of synchronous architecture. A need further exists to provide a system that eliminates the possibility of catastrophic central clock failure and provides redundancy and scalability. Finally, a need exists for an SXO module that provides the benefits hoped for in the dual bus system described in the Boroditsky paper.

The invention therefore provides a crystal oscillator-based module, which includes a conditioning circuit for receiving a sync signal from a first bus and outputting a conditioned signal. A crystal resonator is connected so as to receive the conditioned signal and so as to output a resonator signal. A sustaining stage amplifier is connected so as to receive the resonator signal and output a sustaining stage signal. A gain control network is connected so as to receive the sustaining stage signal. A synchronization range expansion circuit is connected between the gain control network and the resonator. A buffer receives the sustaining stage signal and outputs a buffered signal. A tri-state buffer has a main input and a control input, the main input being connected to receive the buffered signal. The module also includes a delay circuit connected between Vcc and ground, and connected to the control input of the tri-state buffer. The tri-state buffer also has an output, which is connected to a second bus via a matching network. A crystal oscillator-based module according to the invention might also include an RF Out buffer connected to the output of the receiving buffer and providing an oscillator-synchronized RF output.

Other objects and advantages of the invention will become apparent hereinafter.

BRIEF DESCRIPTION OF THE DRAWINGS

FIG. 2 is a synchronous clock system employing a plurality of the crystal-based oscillator modules shown in FIG. 1.

DETAILED DESCRIPTION OF THE INVENTION

Figure 1:
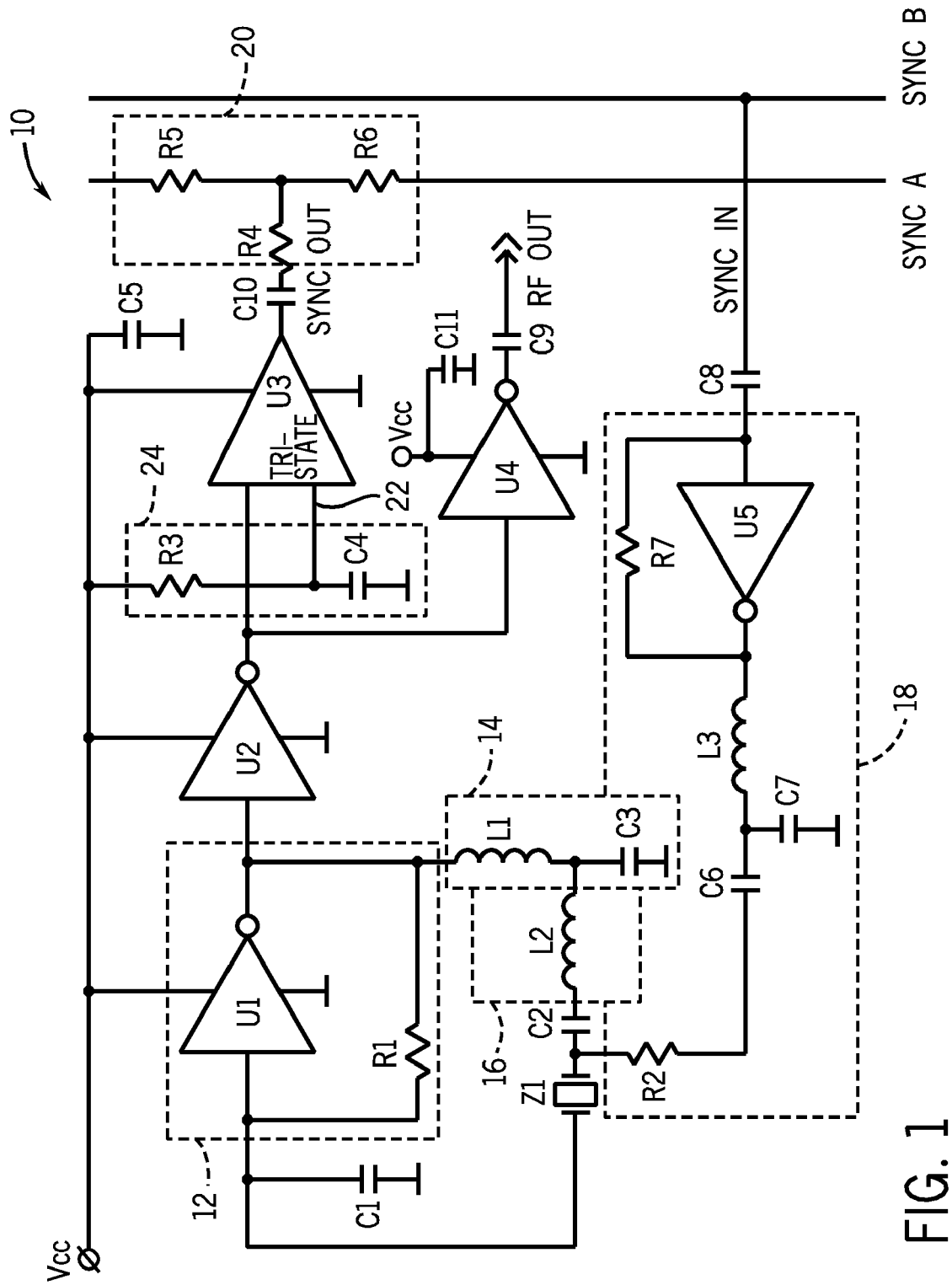
FIG. 1 is a schematic of a crystal-based oscillator module constructed according to a preferred embodiment of the invention.

As shown in FIG. 1, a synchronized crystal oscillator (SXO) module 10 according to a preferred embodiment of the invention includes a sustaining stage amplifier 12, in this case formed by a CMOS inverter gate U1 with a biasing resistor R1, and a phase shifting, gain control network 14, formed by inductor L1 and capacitor C3. Further included is a resonator Z1 (in this case a quartz crystal), connected in series with a synchronization range expansion circuit 16. Circuit 16 allows a significant reduction in the cost of the system and improves phase noise and jitter performance. This goal is achieved by using a higher Q, less pullable and much less expensive overtone crystal resonator in resonator Z1. In the embodiment shown, synchronization range expansion circuit 16 is formed by an inductor L2, connected in series with resonator Z1. Capacitor C1 provides a phase shift function, and capacitor C2 provides a DC blocking function.

The signal enters the SXO module 10 from the Sync B bus, which is opposite to the Sync A bus, to which this module outputs its sync signal. That is, according to the invention and as shown in FIG. 2, there is also at least one other SXO module connected to Sync A and to Sync B, but the other SXO module is has its Sync In connected to Sync A and its Sync Out connected to Sync B. The effect of this alternating connection is to prevent attempts by either SXO module to synchronize on itself For best results, SXO modules 10 should be added in pairs, up to about 3-5 pairs, and most preferably at least five pairs, with their connections alternated as described here and shown in FIG. 2, although they can be added singly thereafter.

It should be noted here that if there were no signal from the Sync B bus, the oscillation from resonator Z1 is self sustaining and would occur at the free-running frequency determined by the properties of the resonator.

The incoming synchronization signal is conditioned for proper amplitude and phase by a conditioning circuit 18. In the embodiment shown, conditioning circuit 18 is formed by a CMOS inverter U5 biased by a resistor R7, together with an LC delay section formed by inductor L3 and capacitor C7, and a dumping resistor R2. Capacitors C6 and C8 are DC blocking capacitors.

The oscillator signal is buffered by a CMOS inverter gate U2 and then split in two directions. One path goes through an RF Out buffer, CMOS inverter gate U4, and provides the oscillator-synchronized RF output to the system. The other path goes through a tristate buffer U3, through a matching network 20 if necessary, and finally to the Sync A bus, opposite to the one from which the sync signal for this module was received, which was the Sync B bus. Matching network 20 is best formed by resistors R4, R5, R6, where R5 and R6 are connected in series in the bus, and R4 is connected between the tristate buffer output and the node between resistors R5 and R6. Tristate buffer U3 also has a control input 22, which is connected to a delay circuit 24 formed by resistor R3 and capacitor C4. The values of resistor R3 and capacitor C4 are selected so that the delay circuit 22 has a time constant of at least one order of magnitude longer than the oscillator start-up time. This feature allows for a "hot-swapping" capability of the system by not allowing the module 10 to output its sync signal to the output bus before the oscillation is established and synchronized to the sync signal on the input bus. It also allows for smooth power-up sequence if all of the modules connected to the Sync A and Sync B busses are powered up simultaneously. Capacitors C9 and C10 are DC blocking capacitors. Capacitors C5 and C11 are decoupling capacitors to decouple the collector supply line Vcc.

The sync signal is thus injected in a node, so that it will be in phase with self sustained oscillation, and be filtered by the resonator Z1 before being applied to the amplifier input Sync Out.

While the apparatus described above is effectively adapted to fulfill its intended objectives as set forth, it is to be understood that the invention is not intended to be limited to the specific preferred embodiments of synchronized crystal oscillator module as described in this description. Rather, it is to be taken as including all reasonable equivalents to the subject matter of the claims as set out below.

The invention claimed is:

1. A crystal oscillator-based module, comprising:
   a conditioning circuit for receiving a sync signal from a first bus and outputting a conditioned signal;
   a crystal resonator connected so as to receive the conditioned signal and output a resonator signal;
   a sustaining stage amplifier connected so as to receive the resonator signal and output a sustaining stage signal;
   a gain control network connected so as to receive the sustaining stage signal;
   a synchronization range expansion circuit connected between the gain control network and the resonator;
   a buffer for receiving the sustaining stage signal and outputting a buffered signal;
   a tri-state buffer having a main input, a control input, and an output, the main input connected to receive the buffered signal, and the output connected to a second bus.

2. A crystal oscillator-based module as recited in claim 1, further comprising a delay circuit formed by a resistor connected in series with a capacitor between Vcc and ground and wherein the control input of the tri-state buffer is connected to the node between the resistor and the capacitor.

3. A crystal oscillator-based module as recited in claim 2, further comprising an RF Out buffer connected to the output of the receiving buffer and providing an oscillator-synchronized RF output.

4. A crystal oscillator-based module as recited in claim 3 wherein the conditioning circuit includes a CMOS inverter biased by a resistor, together with an LC delay section and a dumping resistor.

5. A crystal oscillator-based module as recited in claim 4 wherein the sustaining stage amplifier includes a CMOS inverter and a biasing resistor.

6. A crystal oscillator-based module as recited in claim 5 wherein the gain control network includes an inductor connected in series with a capacitor.

7. A crystal oscillator-based module as recited in claim 6 wherein the synchronization range expansion network includes an inductor connected in series with the crystal resonator.

8. A crystal oscillator-based module as recited in claim 7 wherein the output of the tristate buffer is connected to the second bus via a matching network, which is formed of two resistors connected in series with each other and the second bus, and a third resistor connected between the output of the tri-state buffer and the node between the two series connected resistors.

9. A synchronous clock system, comprising:
   a first sync bus;
   a second sync bus;
   a first crystal oscillator-based module, comprising:
      a conditioning circuit for receiving a sync signal from the first sync bus and outputting a conditioned signal;
      a crystal resonator connected so as to receive the conditioned signal and output a resonator signal;
      a sustaining stage amplifier connected so as to receive the resonator signal and output a sustaining stage signal;
      a gain control network connected so as to receive the sustaining stage signal;
      a synchronization range expansion circuit connected between the gain control network and the resonator;
      a buffer for receiving the sustaining stage signal and outputting a buffered signal;
      a tri-state buffer having a main input, a control input, and an output, the main input connected to receive the buffered signal, and the output connected to the second sync bus; and
   a second crystal oscillator-based module, comprising:
      a conditioning circuit for receiving a sync signal from the second sync bus and outputting a conditioned signal;
      a crystal resonator connected so as to receive the conditioned signal and output a resonator signal;
      a sustaining stage amplifier connected so as to receive the resonator signal and output a sustaining stage signal;
      a gain control network connected so as to receive the sustaining stage signal;
      a synchronization range expansion circuit connected between the gain control network and the resonator;
      a buffer for receiving the sustaining stage signal and outputting a buffered signal;
      a tri-state buffer having a main input, a control input, and an output, the main input connected to receive the buffered signal, and the output connected to the first sync bus.

10. A synchronous clock system as recited in claim 9, wherein at least one of the crystal oscillator based modules includes an RF Out buffer connected to the output of the receiving buffer and providing an oscillator-synchronized RF output.

11. A synchronous clock system as recited in claim 10 wherein at least one of the conditioning circuits includes a CMOS inverter biased by a resistor, together with an LC delay section and a dumping resistor.

12. A synchronous clock system as recited in claim 11 wherein at least one of the sustaining stage amplifiers includes a CMOS inverter and a biasing resistor.

13. A synchronous clock system as recited in claim 12 wherein at least one of the gain control networks includes an inductor connected in series with a capacitor.

14. A synchronous clock system as recited in claim 13 wherein at least one of the synchronization range expansion networks includes an inductor connected in series with the crystal resonator.

15. A synchronous clock system as recited in claim 14 wherein at least one of the crystal oscillator-based modules further comprises a delay circuit formed by a resistor connected in series with a capacitor between Vcc and ground and wherein the control input of the tri-state buffer is connected to the node between the resistor and the capacitor.

16. A synchronous clock system as recited in claim 15 wherein at least one of the tristate buffer outputs is connected to the respective sync bus via a matching network, which is formed of two resistors connected in series with each other and the respective bus, and a third resistor connected between the output of the tri-state buffer and the node between the two series connected resistors.

* * * * *